United States Patent [19]
Wilczak et al.

[11] Patent Number: 5,660,968
[45] Date of Patent: Aug. 26, 1997

[54] NEGATIVE WORKING, PEEL DEVELOPEABLE, SINGLE SHEET COLOR PROOFING SYSTEM WITH IMPROVED BACKGROUND COLOR

[75] Inventors: Wojciech A. Wilczak, Jersey City; Gabor I. Koletar, Berkeley Heights, both of N.J.

[73] Assignee: Bayer Corporation, Pittsburgh, Pa.

[21] Appl. No.: 435,906

[22] Filed: May 5, 1995

[51] Int. Cl.$^6$ ..................... G03C 3/00
[52] U.S. Cl. ............ 430/253; 430/254; 430/257; 430/260; 430/270.1; 430/293; 430/143; 430/913; 430/915; 430/919; 430/920
[58] Field of Search ............ 430/253, 254, 430/257, 260, 270, 293, 143, 913, 915, 919, 920

[56] References Cited

U.S. PATENT DOCUMENTS

| | | | |
|---|---|---|---|
| 3,987,037 | 10/1976 | Bohham et al. | 260/240 |
| 4,292,152 | 9/1981 | Lechtken et al. | 430/627 |
| 4,298,738 | 11/1981 | Lechtken et al. | 546/22 |
| 4,845,011 | 7/1989 | Wilczat et al. | 430/281 |
| 4,868,091 | 9/1989 | Boettcher et al. | 430/281.1 |
| 5,212,307 | 5/1993 | Wilczak | 544/194 |
| 5,300,399 | 4/1994 | Wilczak | 430/253 |
| 5,436,112 | 7/1995 | Hsieh et al. | 430/253 |

*Primary Examiner*—Geraldine Letscher
*Attorney, Agent, or Firm*—Roberts & Mercanti

[57] ABSTRACT

In the present invention, one produces a negative-acting color proofing element comprising, sequentially: a strippable cover sheet which is transparent to actinic radiation; a crosslinked layer containing a polymer having phenolic groups; a color layer, containing a colorant, a polymeric binder, a polymerizable monomer and, optionally, a photoinitiator; a photoadhering layer, containing a linear photosensitive polymer containing ethylenically unsaturated, free-radical polymerizable groups and having a weight average molecular weight greater than 3,000, a polymerizable monomer, and, optionally, a free radical photoinitiator, a thermoplastic adhesive layer; and a receiver sheet, at least one of the color layer and the photoadhering layer containing a photoinitiator, which is brightener.

34 Claims, No Drawings

NEGATIVE WORKING, PEEL DEVELOPEABLE, SINGLE SHEET COLOR PROOFING SYSTEM WITH IMPROVED BACKGROUND COLOR

BACKGROUND OF THE INVENTION

The present invention relates to color proofing films, or more particularly to a negative working peel-apart photosensitive element capable of producing negative images upon treatment with actinic radiation and peel development.

In the graphic arts, it is desirable to produce a three or more color proof to assist in correcting a set of color separation films prior to using them to produce printing plates. The proof should reproduce the color quality that will be obtained during the printing process. The proof must be a consistent duplicate of the desired halftone image. Visual examination of a color proof should show the color rendition to be expected from press printing using the color separations and any defects on the separations which might need to be altered before making the printing plates.

Color proofing sheets for multicolored printing can be made by using a printing press or proof press. This requires that all of the actual printing steps be performed. Therefore, this conventional method of color proofing is costly and time consuming.

Photoimaging processes can also be used to produce a color proof. There are two general types of photoimaging methods, namely the overlay type and the single sheet type. In the overlay type of color proofing method, an independent transparent plastic support is used for producing an image of each color separation film by applying a photosensitive solution of the corresponding color. A plurality of such supports carrying images of the corresponding colors are then superimposed upon each other over a white sheet to produce a color proofing composite. The primary advantage of the overlay method is that proofs can be made quickly and can serve as a progressive proof by combining any two or three colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films on a single receiver sheet. This can be accomplished by sequentially applying colorants or colored, photosensitive layers to a single opaque support. This method more closely resembles the actual printing process and eliminates the color distortion inherent in the overlay system. Examples of such single sheet approaches are contained in U.S. Pat. Nos. 3,574,049; 3,671,236; 4,260,673; 4,366,223; 4,650,738; 4,656,114; and 4,659,642.

Various processes for producing single sheet color proofs of an image embodying thermal transfer and photopolymerization techniques are known, for example, from U.S. Pat. Nos. 3,060,023; 3,060,024; 3,060,025; 3,481,736; and 3,607,264. In these processes, a photopolymerizable layer coated on a suitable support is imagewise exposed through a color separation film. The surface of the exposed layer is then pressed into contact with an image receptive surface of a separate element. At least one of the elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material.

In U.S. Pat. No. 3,721,557, a method for transferring colored images is shown which provides a stripping layer coated between a photosensitive element and a support. When the photosensitive layer is exposed to actinic light and developed, the more soluble portions are selectively removed to produce a visible image. The image carrying support is pressed against an adhesive coated receptor member and the carrier support is subsequently stripped to accomplish the transfer of the image. A fresh layer of adhesive must be applied to the receptor for each subsequent transfer.

U.S. Pat. No. 4,596,757 provides a method for transferring images or solid colors which are subsequently imaged. The photosensitive material comprises a carrier support having sequentially disposed thereon a release layer; a colored, photopolymerizable layer; and an adhesive layer. The material can undergo exposure, lamination to a temporary support, wet development, and then lamination to a receptor sheet. Alternatively, the photosensitive material can be laminated to a receptor sheet, undergo exposure, and then wet processed. Both processes require development in an aqueous medium.

In U.S. Pat. No. 4,489,154, a process is claimed which produces a single layer color proof without wet development. The photosensitive material comprises a strippable cover sheet; a colored photoadherent layer; a nonphotosensitive organic contiguous layer; and a sheet support. The material is exposed and peel developed. The positive or negative image is transferred to a receiver base. A fresh layer of adhesive must be applied to the receptor for each subsequent transfer.

Finally, U.S. Pat. No. 5,300,399 teaches a negative-acting color proofing element. The element sequentially comprises a strippable cover sheet which is transparent to actinic radiation; a crosslinked layer containing a polymer having phenolic groups; a color layer, containing a colorant, a polymeric binder, a polymerizable monomer and, optionally, a photoinitiator; a photoadhering layer, containing a linear photosensitive polymer containing ethylenically unsaturated, free-radical polymerizable groups and having a molecular weight greater than 3,000, a polymerizable monomer, and, optionally, a free radical photoinitiator; a thermoplastic adhesive layer; and a receiver sheet, at least one of the color layer and the photoadhering layer containing the photoinitiator. A single sheet, negative working color proofing film having improved image quality with very high resolution has been found by using the photosensitive polymer in the photoadhering layer of the article of this invention. However, it is sometimes desirable to blanket-expose the finished proof to actinic radiation in order to photoharden the top layer in order to provide blocking-and-scratch resistance. It was found that the photoadhering layer taught in U.S. Pat. No. 5,300,399 becomes discolored (yellows) when exposed to UV-light.

It is an object of the present invention to remedy that unwanted discoloration when the color proofing element is exposed to UV-light.

SUMMARY OF THE INVENTION

In the present invention, one produces a negative-acting color proofing element. The element sequentially comprises:

1) a strippable cover sheet which is transparent to actinic radiation; 2) a crosslinked layer containing a polymer having phenolic groups; 3) a color layer, containing a colorant, a polymeric binder, a polymerizable monomer and, optionally, a photoinitiator; 4) a photoadhering layer, containing a linear photosensitive polymer containing ethylenically unsaturated, flee-radical polymerizable groups and having a weight average molecular weight (as determined by GPC) greater than 3,000, a polymerizable monomer, and, optionally, a free radical photoinitiator; 5) a thermoplastic adhesive layer; and 6) a receiver sheet, at least one of the color layer and the photoadhering layer containing the photoinitiator. A single sheet, negative working color proofing film having improved image quality with very high resolution is provided by using the photosensitive polymer in the photoadhering layer of the color proofing element of the present invention. In addition, using an acyl or diacyl phosphine oxide compound, in combination with a fluorescent brightener, as photoinitiator (as disclosed in co-pending U.S. application Ser. No. 435,560, filed the same date as this Application) or using a hexaaryl biimidazole compound, in combination with a chain transfer agent and an optical brightener, as photoinitiator, both unexpectedly eliminated color proof discoloration on postexposure, which allows optional photohardening of the top layer of the color proof element with UV light.

The present invention relates to a negative-acting, single sheet color proofing element which comprises, in order from top to bottom:

(i) a strippable, transparent cover sheet;

(ii) a crosslinked layer, which comprises an organic polymer having phenolic groups;

(iii) a color layer, which comprises an organic binder, a polymerizable monomer, a colorant, and optionally, a photoinitiator, wherein the binder is present in sufficient amount to bind the color layer components into a uniform film, wherein the optional photoinitiator, when present, is present in sufficient amount to initiate polymerization of the polymerizable monomer in the color layer, wherein the polymerizable monomer is present in the color layer in sufficient amount to provide image differentiation when the color proofing element is imagewise exposed to actinic radiation, and wherein the colorant is present in an amount sufficient to uniformly color the color layer;

(iv) a photoadhering layer, which comprises a photosensitive polymer having ethylenically unsaturated, photocrosslinkable groups and a weight average molecular weight greater than 3,000, a polymerizable monomer having at least one ethylenically unsaturated group, and an optional photoinitiator, wherein the optional photoinitiator, when present, is present in sufficient amount to initiate polymerization of the polymerizable monomer in the photoadhering layer and the crosslinking of the photosensitive polymer, and wherein at least one of either the color layer or the photoadhering layer contains a photoinitiator, which comprises at least one of:

a. a chromophore-substituted bis-trichloromethyl-s-triazine, b. a combination of an acyl or diacyl phosphine oxide compound and a fluorescent optical brightener, or c. a combination of a hexaaryl biimidazole compound, a chain-transfer agent and a fluorescent optical brightener;

(v) a thermoplastic adhesive layer; and (vi) a support sheet.

The present invention also relates to a method for producing a negative image which comprises:

(A) providing a photosensitive color proofing element which comprises, in order from top to bottom:

(i) a strippable, transparent cover sheet;

(ii) a crosslinked layer, which comprises a polymer having phenolic groups;

(iii) a color layer, which comprises an organic binder, a polymerizable monomer, a colorant, and optionally, a photoinitiator, wherein the binder is present in sufficient amount to bind the color layer components into a uniform film, wherein the optional photoinitiator, when present, is present in sufficient amount to initiate polymerization of the polymerizable monomer in the color layer, wherein the polymerizable monomer is present in sufficient amount to provide image differentiation when the color proofing element is imagewise exposed to actinic radiation, and wherein the colorant is present in an amount sufficient to uniformly color the color layer;

(iv) a photoadhering layer, which comprises a photosensitive polymer having ethylenically unsaturated, photocrosslinkable groups and a weight average molecular weight greater than 3,000, a polymerizable monomer having at least one ethylenically unsaturated group, and an optional photoinitiator, wherein the optional photoinitiator, when present, is present in sufficient amount to initiate polymerization of the polymerizable monomer in the photoadhering layer and the crosslinking of the photosensitive polymer, and wherein at least one of either the color layer or the photoadhering layer contains a photoinitiator, which comprises at least one of:

(a) a chromophore-substituted bis-trichloromethyl-s-triazine, (b) a combination of an acyl or diacyl phosphine oxide and a fluorescent brightener, or (c) a combination of a hexaaryl biimidazole compound, a chain-transfer agent and a fluorescent brightener;

(v) a thermoplastic adhesive layer, (B) laminating the photosensitive color proofing element to a receiver sheet;

(C) imagewise exposing the color layer and the photoadhering layer to actinic radiation through the transparent cover and crosslinked layer;

(D) peeling apart the receiver sheet and the transparent cover sheet, leaving exposed areas of the color layer attached to the receiver sheet via the photoadhering layer and adhesive layer, and unexposed areas being removed with the cover sheet and the crosslinked phenolic layer, thereby forming a colored negative image on the receiver sheet; and (E) optionally repeating steps A) through D) at least once wherein another photosensitive element having at least one different colorant in the color layer, is transferred via its photoadhering and adhesive layers to the negative image previously produced on the receiver sheet, with the proviso that initiator (b) or (c) must be present at least in the photoadhering layer of the top photosensitive element.

(F) either:

(i) blanket exposing the image created in step (E) to actinic radiation to photoharden the top layers; or providing the image created in step (E) with a protective layer or layers.

DETAILED DESCRIPTION OF THE PREFERRED EMBODIMENT

In the usual full color proofing guide, four distinct colored images are formed, namely magenta, cyan, yellow, and black. When the images are superimposed upon each other, a simulated full color reproduction results. As hereinbefore described, one begins the process of the present invention by preparing a photosensitive element which has a cover sheet with a polymerizable layer carried thereon.

In the preferred embodiment, the cover sheet may be composed of any suitable flexible sheet material, provided it is transparent to the actinic radiation used to imagewise expose the color layer and adhesive layer. In the preferred embodiment, the cover sheet has a surface which is dimensionally stable when undergoing the herein specified treatment process. That is, it should have substantially no change in dimensions under heating in the range of from about 60° C. to 120° C., during lamination. One preferred material is polyethylene terephthalate. In the preferred embodiment, the cover sheet has a thickness of from about 1 to about 10 mils, a more preferred thickness is from about 2 to about 5 mils and most preferably from about 2 to about 3 mils. Suitable films nonexclusively include Melinex® 054, 504, 505, and 582 films available from ICI, and Hostaphan® 4400, 4500, and 4540 films available from Hoechst Celanese Corporation. The surface of the support may be smooth or it may be provided with a matte texture as with Melinex® 475 film. A smooth surface is preferred because a rough surface scatters the actinic radiation and thereby reduces the resolution capability of the element.

The phenolic layer is applied from a solvent coating composition to the cover sheet. Possible solvents include organic solvents as well as water. The phenolic polymer can be a novolak (cresol-formaldehyde resin), polyhydroxystyrene homo- and co-polymers, acrylic polymers containing phenolic groups, etc. Crosslinking of the polymer can be achieved by the use of, nonexclusively, polyisocyanates, melamine-formaldehyde resins, urea-formaldehyde resins, epoxy resins, aziridine resins, and heat, acrylic monomers and light, etc. The crosslinked phenolic layer should be insoluble in solvents used to coat the subsequent layer.

The color layer is applied, from a solvent coating composition, to the crosslinked phenolic layer. Organic solvents are preferred for the color layer because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, diacetone alcohol, and gamma-butyrolactone.

The polymerizable monomers in the color layer and in the photoadhering layer preferably comprise addition polymerizable, non-gaseous (boiling temperature above 100° C. at normal atmospheric pressure), ethylenically-unsaturated organic compounds containing at least one, and preferably at least two, terminal ethylenically unsaturated groups, and being capable of forming a high weight average molecular weight polymer by free radical initiated, chain propagating addition polymerization. The most preferred compounds are acrylate or methacrylate monomers, as are well known in the art. Suitable polymerizable monomers nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol-A-ethoxylate dimethacrylate, trimethylolpropane ethoxylate triacrylate, trimethylolpropane propoxylate triacrylate, and bisphenol A diepoxide dimethacrylate. The polymerizable monomer in the color and in the photoadhering layers can be the same or different.

Free radical liberating photoinitiators used in the color layer and/or photoadhering layer include chromophore-substituted bis-trichloromethyl-s-triazines, or a combination of an acyl or diacyl phosphine oxides and a fluorescent optical brightener, or combination of a hexaaryl biimidazole, chain-transfer agent, and a fluorescent optical brightener. It was determined that the chromophore-substituted bis-trichloromethyl-s-triazines have a tendency to discolor when exposed to UV (actinic) light. Therefore, they are unsuitable for use as photoinitiators in the top layer of the proof, which is subject to UV action, whether on postexposure or during storage. They can, however, be used in the lower layers. The copending U.S. application Ser. No. 435,560, Attorney's Docket DA-3098, describes a novel photoinitiator composition comprising an acyl or diacyl phosphine oxide compound, in combination with a fluorescent optical brightener. Surprisingly, this combination, when used in the top layer of the color proofing element, not only does not substantially change color on exposure to actinic light, but also protects the lower layers from harmful radiation.

In addition, U.S. Pat. No. 3,854,950 teaches the use of hexaaryl biimidazoles, chain transfer agents and fluorescent brighteners as photoinitiators in polymerizable compositions. Surprisingly, these compositions perform similarly to above-mentioned acyl or diacyl phosphine oxide/fluorescent optical brightener compositions, in the present invention.

The photoinitiator used in the color layer and/or photoadhering layer may be the same or different.

The color layer may also contain a binding resin which not only determines the hardness and/or flexibility of the coating, but is also used to control the dry development. Binding resins found suitable for the color layer are polyvinyl acetates, styrene/maleic anhydride copolymers and their half esters; acrylic polymers and copolymers; polyamides; polyvinyl pyrrolidones; cellulose and its derivatives; phenolic resins; and the like. The most preferred binding resins are polyvinyl acetates and acetals, such as UCAR® resins available from Union Carbide, and polyvinyl formal, polyvinyl butyral and polyvinyl propional.

Dyes may be included in the color layer to spectrally sensitize the photoinitiator, such as described in U.S. Pat. Nos. 4,282,309 and 4,454,218, and European Patent Applications 0,179,448 and 0,211,615.

In the preferred embodiment: 1) the dry color layer has a coating weight range of from about 0.1 to about 5 g/m$^2$, preferably from about 0.4 to about 2 g/m$^2$,2) the crosslinked phenolic layer has a coating weight range of from about 0.1 to about 5 g/m$^2$, preferably from about 0.4 to 1.0 g/m$^2$.

In the practice of the present invention, the optional photoinitiator component is preferably present in the color layer in an amount ranging from about 0.01 to 20% based on the weight of the solids in the layer. A preferred range is from about 0.1 to 15%, more preferably from 1 to 10%.

In the practice of the present invention, the optional photoinitiator component is preferably present in the photoadhering layer in an amount ranging from about 1 to 40% based on the weight of the solids in the layer. A preferred range is from about 2 to 30%, more preferably from 5 to 20%.

Dyes and/or pigments are included in the color layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer (micron).

Nonexclusive examples of colorants usable in the present invention are as follows: Permanent Yellow G (C.I. 21095), Permanent Yellow GK (C.I. 21100), Permanent Yellow DHG (C.I. 21090), Permanent Rubine L6B (C.I. 15850:1), Permanent Pink F3B (C.I. 12433), Hostaperm® Pink E (73915), Hostaperm® Red Violet ER (C.I. 46500), Permanent Carmine FBB (12485), Hostaperm® Blue B2G (G.I. 74160), Hostaperm® Blue A2R (C.I. 74160), and Printex® 25. Most of these are products of Hoechst AG. They can be used separately or blended for a desired color.

Other ingredients which may be present in the color layer are thermal polymerization inhibitors, plasticizers, tackifiers, oligomers, residual solvents, surfactants, inert fillers, antihalation agents, hydrogen atom donors, photoactivators, and optical brightening agents.

In a preferred embodiment of the present invention, the binder component is preferably present in the color layer in an amount sufficient to bind the components in a uniform mixture and a to provide uniform film, when it is coated on a substrate. It is preferably present in an amount ranging from about 10 to about 90%, based on the weight of the solids in the color layer. A more preferred range is from about 20 to about 80%.

In the preferred embodiment, the polymerizable monomer is present: 1) in the color layer in an amount of from about 1 to about 60% by weight of the total solids in the color layer, more preferably from about 5% to about 50%, and 2) in the photoadhering layer from about 1 to about 50%, by weight of the total solids in photoadhering layer, more preferably from about 10 to about 40%.

In the practice of the present invention, the colorant component is preferably present in an amount sufficient to uniformly color the color layer. It is preferably present in an amount ranging from about 5 to about 50%, based on the weight of the solids in the color layer. A more preferred range is from about 8 to about 40%.

A plasticizer may also be included in the color layer or the photoadhering layer of the color proofing element of the present invention, to prevent coating brittleness and to keep the composition pliable, if desired. Suitable plasticizers nonexclusively include dibutylphthalate, tripolyphosphate, and substituted analogs thereof; and preferably, dioctylphthalate.

Adhered to the color layer is the photoadhering layer. The photoadhering layer preferably comprises a photosensitive polymer, a photoinitiator, and a polymerizable monomer, as hereinbefore defined.

To form the photoadhering layer, the components may be dissolved in a solvent, or mixture of solvents, to facilitate application of the composition to the substrate. Suitable solvents for this purpose nonexclusively include water, tetrahydrofuran, n-butyl acetate, isobutyl isobutyrate, glycol ethers such as propylene glycol monomethyl ether and methyl cellosolve, alcohols such as ethanol and n-propanol, and ketones such as methyl ethyl ketone. In general, the solvent system is evaporated from the coating composition, once it is applied to an appropriate substrate. However, some insignificant amount of solvent may remain as residue. In addition, the monomer from the photoadhering layer tends to diffuse into the color layer during overcoating process, so one way of providing the color layer with the monomer is not to include it in the coating solution of the color layer, but to let it migrate to the color layer from the photoadhering layer, during coating and drying process or during lamination of the layers. This process of monomer migration, via diffusion, is well known to those skilled in the art of creating multilayer color imaging systems. According to the present invention, it is important that the polymerizable monomer be present in the color layer when the element is exposed to actinic radiation, regardless of the manner in which it became the part of the color layer.

In the preferred embodiment, the photoadhering layer has a coating weight between about 2 and 20 $g/m^2$. The most preferred weight is from about 4 to 10 $g/m^2$.

The photoadhering layer contains a polymerizable monomer and may optionally contain such other desired components as uv absorbers, antistatic compositions, inert fillers, thermal polymerizable inhibitors, residual solvents, surfactants, antihalation agents, hydrogen atom donors, tackifiers, and plasticizers. Suitable photosensitive polymers nonexclusively include: a urethane adduct of polyvinyl butyral or other acetal resins containing hydroxy groups and isocyanatoethyl methacrylate, or a reaction product of a hydroxy-containing acetal resins with methacrylic anhydride, acrylic acid, acryloyl chloride, etc. Acrylic polymers containing hydroxy groups can also be used as substrates with all of the above (meth)acrylic group-containing reagents, as can polyvinyl alcohols and their copolymers, phenolic resins, etc. Other reactive organic groups which can be on the (meth)acrylated polymers nonexclusively include: amino, carboxyl, epoxy, etc. The (meth)acrylated polyvinyl acetal polymers are preferred. The photoadhering layer may optionally contain a uv absorber such as Uvinul® D-50 available from GAF. It may also contain a plasticizer such as Resoflex® R-296, available from Cambridge Industries. It may also contain antistatic compounds, such as Gafac® and Gafstat® antistats available from GAF.

The thermoplastic adhesive layer should be coated directly on the photoadhering layer. The coating weight should be from about 2–20 $g/m^2$, more preferred from about 5–15 $g/m^2$, most preferred from about 6–10 $g/m^2$. The adhesive layer should be coated from a solvent which does not disturb the photoadhering layer underneath. Water is the preferred solvent. Examples of thermoplastic resins coatable out of a water solution nonexclusively include Carboset® acrylic resins, polyvinyl acetate/crotonic acid copolymers, polyvinyl pyrrolidone/polyvinyl acetate copolymers, polyvinyl acetate emulsions, styrene/maleic anhydride copolymers, urethane polymers, etc.

The adhesive layer should be transferable to a receiver sheet in a temperature range of from about 50° C. to about 180° C., preferably from about 60° C. to 120° C., more preferably from about 60° C. to 100° C., when laminated with heat and pressure. The plasticizer may be present in an amount of up to about 10% by weight and the UV absorber up to about 10% by weight.

Receiver sheets may comprise virtually any material which can withstand the laminating and dry development processes. White plastic sheets, such as adhesion pretreated polyester Melinex® 3020 film available from ICI, are useful for this purpose. Plastic coated paper sheets, such as polyethylene coated paper available from Schoeller, may also be used. Other bases may include wood, glass, metal, paper and the like.

In place of direct overcoating one can assemble the hereinbefore described photosensitive element by hot-laminating the layers to each other, as is well known in the art.

Lamination may be conducted by putting the adhesive layer in contact with the receiver sheet and then introducing the materials into the nip of a pair of heated laminating rollers under suitable pressure. Suitable laminating temperatures usually range from about 60° C. to 120° C., preferably from about 70° C. to 100° C. The color proofing element is then exposed by means well known in the art. Such exposure may be conducted by exposure to actinic radiation from light source through a conventional halftone negative color separation, under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering.

After exposure, a negative image is anchored via the photoadhering layer and adhesive layer on the receiver sheet by stripping the transparent cover sheet from the receiver sheet at room temperature with a steady, continuous motion. The preferred peel angle relative to the peel direction is greater than 90°. The delamination leaves the photoexposed areas of the color layer attached to the photoadhering layer which, in its entirety, is attached to the receiver sheet via the adhesive layer on the receiver sheet. The nonexposed areas of the color layer remain on the cross linked layer on the cover sheet, which has been peeled apart from the receiver sheet. Thus, a negative image remains on sheet.

In order to attain a multicolored image, another photosensitive element comprising, in order, a transparent cover sheet, crosslinked phenolic layer, a color layer, a photoadhering layer and an adhesive layer is laminated onto the first image on the receiver sheet, exposed, and the second color dry developed by peeling apart the receiver sheet from the cover sheet of the additional photosensitive element. The second negative image remains with its photosensitive adhesive layer with the first image. A third and a fourth image may be added in a manner similar to that used to produce the second image. In the usual case, four colored layers are employed to produce a full color reproduction of a desired image. These four colors are cyan, magenta, yellow and black.

A matte finish of the final image may be obtained by embossing the shiny, top surface of the image with a matte material, such as Melinex® 377 film available from ICI. This is done by laminating together the final image and matte material and peeling the matte material away.

The final four color proof may be given a uniform, blanket exposure to photoharden the exposed, colored areas on the receiver base. A protective layer or layers may also be laminated on top of the last dry developed layer.

The following nonlimiting examples serve to illustrate the present invention.

COMPARATIVE EXAMPLE 1

Photoadhering Layer Solution

To prepare the polymer with ethylenically unsaturated groups useful in photoadhering layer, 50 g of Butvar® 79 polyvinyl butyral resin from Monsanto containing free hydroxyl groups (10.5–13%, expressed as % polyvinyl alcohol) was placed in 200 g of n-butyl acetate with stirring, at room temperature. To this solution, there were added 20 g of isocyanatoethyl methacrylate (Monomer, Polymer & Dajac Laboratories, Inc.), along with 0.05 g of dibutyltin dilaureate, as catalyst. The mixture was left stirring overnight, and after that time no isocyanate band was seen in the IR spectrum of the polymer. Thus, a polymer containing methacrylate groups was created.

To 10 g of the above stock solution, there were added 0.38 g of Sartomer® 399 Dipentaerythritol pentaacrylate (available from the Sartomer Co.), as monomer, and 0.1 g of 2-biphenyl-4,6-bis-trichloromethyl-s-triazine as initiator, completing the photoadhering layer formulation.

Phenolic Layer Solution
1. Methyl Ethyl Ketone (MEK)—47 g
2. Dowanol® PM (Propylene Glycol Methyl Ether, available from Dow Chemicals Corp)—47 g
3. Poly-p-hydroxystyrene (6,200 MW, available from Hoechst Celanese Corporation)—3 g
4. Melamine-formaldehyde resin (Cymel® 303, Cyanamid) —1 g
5. p-Toluene sulfonic add—0.2 g This solution was coated on Melinex® 505, 2 mil polyester available from ICI to coating weight of 0.5 g/m$^2$. The layer subsequently crosslinked upon drying in the oven at 110° C. for 2 minutes. Crosslinking was verified by MEK rubs.

Color Layer Solution
1. Tetrahydrofuran—21.7 g
2. Dowanol® PM—43.42 g
3. Diacetone alcohol—16.18 g
4. Urethane adduct of 1 mole of trimethylhexamethylene diisocyanate with 2 moles of 2-hydroxyethyl, 4,6-bis-acryloxyethyl isocyanurate (Aronix® M-215, Mitsui)—3.38 g
5. 2-biphenyl-4,6-bis-trichloromethyl-s-triazine -0.84 g
6. Magenta Formvar® Dispersion (19.8% solution) (The Dispersion consists, in percent by weight, of: 80.2% gamma-butyrolactone, 9.0 Formvar® 12/85 polyvinyl formal resin [available from Monsanto Co.]) and 10.8% Permanent Carmine FB)—14.48 g The color coat solution was coated on the crosslinked phenolic layer on the cover sheet and dried. The coating weight was 0.8 g/m$^2$. The color coat was then overcoated with the above photoadhering layer solution with a Meyer® rod #24 and dried. The coating weight was 6.8 g/m$^2$.

The adhesive solution was Carboset® XL-37 aqueous acrylic dispersion (available from B. F. Goodrich). It was coated on the photoadhering layer with a Meyer® rod #15 and dried. The coating weight was 6 g/m$^2$.

The receiver base was Pressmatch® Commercial Receiver Base, available from Hoechst Celanese Corporation.

The above-described photosensitive element was laminated to the above receiver base using heat and pressure. The thusly prepared composite was imagewise exposed to actinic radiation through the transparent cover sheet using a UGRA target for 15 seconds in a Berkey-Ascor® exposure unit. Peeling away the cover sheet resulted in exposed areas of the color coat staying on the photoadhering layer, which in its entirety remained attached to the receiver sheet via the adhesive layer, while unexposed areas of the color coat were removed together with the cover sheet and the entire phenolic layer. The thusly obtained negative magenta image anchored to the base via the adhesive showed dot reproduction of 3–97% at 150 lines/inch.

EXAMPLE 1

This Example Illustrates the Use of Inventive Photoinitiator System in the Photosensitive Element.

To prepare the polymer with ethylenically unsaturated groups useful in photoadhering layer, 50 g of Butvar® 79 polyvinyl butyral resin from Monsanto containing free hydroxyl groups (10.5–13%, expressed as % polyvinyl alcohol) was placed in 200 g of n-butyl acetate with stirring, at room temperature. To this solution, there were added 20 g of isocyanatoethyl methacrylate (Monomer, Polymer & Dajac Laboratories, Inc.), along with 0.05 g of dibutyltin dilaureate, as catalyst. The mixture was left stirring overnight, and after that time no isocyanate band was seen in the IR spectrum of the polymer. Thus, a polymer containing methacrylate groups was created.

To 10 g of the above stock solution, there were added 0.38 g of Sartomer® 399 Dipentaerythritol pentaacrylate (available from the Sartomer Co.), as monomer, and 0.1 g of 2,4,6-trimethylbenzoyl diphenyl phosphine oxide (Lucirin® TPO, BASF) and 0.05 g of 2,2'-(thiophenediyl)bis(t-butyl benzoxazole) (Uvitex® OB, Ciba) as initiator, completing the photoadhering layer formulation.

The formulations and procedures from Comparative Example 1 were repeated using the above photoadhering layer solution where phosphine oxide/fluorescent brightener initiator replaced the trichloromethyl triazine from Comparative Example 1. The exposure time was only 5 seconds as compared to 15 seconds in Comparative Example 1.

COMPARATIVE EXAMPLE 2

This example shows preparation of a four-color proof resulting in undesireable background color. The formulations for the color layers include the following ingredients in parts by weight.

| Ingredient - Color Layer | Cyan | Yellow | Magenta | Black |
| --- | --- | --- | --- | --- |
| Tetrahydrofuran | 200 | 200 | 200 | 200 |
| 4-hydroxy-4-methyl pentanone | 150 | 150 | 150 | 150 |
| 1-methoxy-2-propanol | 444 | 465 | 489 | 490 |
| Formvar ® 12/85 resin | 12 | 13 | 15 | 18 |
| Sartomer ® 369 (Sartomer Co, Hydroxyethyl isocyanurate triacrylate monomer) | 10 | 12 | 16 | 15 |
| Hostaperm ® B2G | 14 | — | — | — |
| Permanent Yellow GR | — | 14 | — | — |
| Permanent Red FBB | — | — | 24 | — |
| Printex ® 25 - | — | — | — | 24 |

The pigments were dispersed in some of the Formvar® 12/85 and solvents. The color solutions were coated on the crosslinked phenolic layer from Comparative Example 1 with a Meyer® rod #12 and dried. The photoadhering solution from Comparative Example 1 was overcoated on each color layer with a Meyer® rod #24, and dried, as was the Carboset® XL-37 adhesive solution. The receiver base for the four-color proof was Pressmatch® Commercial Receiver Base. The first photosensitive element, magenta, was laminated to the receiver base by using heat and pressure, and imagewise exposed to actinic radiation through the transparent polyester cover sheet for 10 seconds. Upon peeling away the polyester cover sheet, the unexposed areas of the color layer were removed along with it, while the exposed areas of the color layer remained anchored to the base via the photoadhering layer and the adhesive layer. Thus, a negative image was created on the receiver base. The second photosensitive element, yellow, was in turn laminated to the previously created negative magenta image. Upon imagewise exposure to actinic fight via a target in registration with the previous image, and peeling away the strippable sheet, the yellow negative image was created, attached to the previous image via the photoadhering layer and an adhesive layer. Repeating the above procedure for the remaining two colors resulted in a high quality negative color proof.

Upon blanket exposure to UV light in order to photoharden the top layer, the background (photoadhering layer) turned yellow (Yellow density=0.25). This is an undesireable effect in color proofing.

COMPARATIVE EXAMPLE 3

This example shows a preparation of a four-color proof using photoinitiators other than from the present invention, and resulting in undesireable background color. The formulations for the color layers include the following ingredients in parts by weight.

| Ingredient - Color Layer | Cyan | Yellow | Magenta | Black |
| --- | --- | --- | --- | --- |
| Tetrahydrofuran | 200 | 200 | 200 | 200 |
| 4-hydroxy-4-methyl pentanone | 150 | 150 | 150 | 150 |
| 1-methoxy-2-propanol | 444 | 465 | 489 | 490 |
| Formvar ® 12/85 resin | 12 | 13 | 15 | 18 |
| Sartomer ® 369 (Sartomer Co, Hydroxyethyl isocyanurate triacrylate monomer) | 10 | 12 | 16 | 15 |
| Hostaperm ® B2G | 14 | — | — | — |
| Permanent Yellow GR | — | 14 | — | — |
| Permanent Red FBB | — | — | 24 | — |
| Printex ® 25 | — | — | — | 24 |

The pigments were dispersed in some of the Formvar® 12/85 and solvents. The color solutions were coated on the crosslinked phenolic layer from Example 1 with a Meyer® rod #12 and dried. The photoadhering solution from Comparative Example 1 was overcoated on Cyan, Yellow, and Magenta color layer with a Meyer® rod #24, and dried.

The following photoadhering solution was used for the Black color layer: To 10 g of the stock photoadhering solution from Comparative Example 1, there were added 0.38 g of Sartomer® 399 Dipentaerythritol pentaacrylate (available from the Sartomer Co.), as monomer, and 0. 1 g of 2-benzyl-2-N,N-diethylamino-1-(4-Morpholinophenyl)-1-Butanone (Irgacure®) 369, CIBA) as initiator.

The adhesive solution from Example 1 was overcoated on C,Y,M and K elements and dried.

Using the procedure from Example 1, the Magenta element was laminated to the support, imagewise exposed and peel-developed. This was followed, in registration, with Cyan and Yellow elements. The last element down, Black, Irgacure® 369 as initiator. This procedure yielded a high-quality 4-color proof.

This proof, when blanket-exposed to actinic radiation in order to photoharden the top layers, turned substantially yellow (Yellow density=0.24)

COMPARATIVE EXAMPLE 4

This example shows a preparation of a four-color proof using photoinitiators other than those of the present invention, and the resulting undesireable background color, and also shows that the mere presence of the fluorescent optical brightener alone, without the photoinitiators utilized in the present invention, does not mask this undesireable effect. The formulations for the color layers include the following ingredients, in parts by weight.

| Ingredient - Color Layer | Cyan | Yellow | Magenta | Black |
|---|---|---|---|---|
| Tetrahydrofuran | 200 | 200 | 200 | 200 |
| 4-hydroxy-4-methyl pentanone | 150 | 150 | 150 | 150 |
| 1-methoxy-2-propanol | 444 | 465 | 489 | 490 |
| Formvar® 12/85 resin | 12 | 13 | 15 | 18 |
| Sartomer® 369 (Sartomer Co, Hydroxyethyl isocyanurate triacrylate monomer) | 10 | 12 | 16 | 15 |
| Hostaperm® B2G | 14 | — | — | — |
| Permanent Yellow GR | — | 14 | — | — |
| Permanent Red FBB | — | — | 24 | — |
| Printex® 25 | — | — | — | 24 |

The pigments were dispersed in some of the Formvar® 12/85 and solvents. The color solutions were coated on the crosslinked phenolic layer from Example 1 with a Meyer® rod #12 and dried. The photoadhering solution from Comparative Example 1was overcoated on Cyan, Yellow, and Magenta color layer with a Meyer® rod//24, and dried.

The following photoadhering solution was used for the Black color layer: To 10 g of the stock photoadhering solution from Comparative Example 1, there were added 0.38 g of Sartomer® 399 Dipentaerythritol pentaacrylate (available from the Sartomer Co.), as monomer, and 0.1 g of 2-benzyl-2-N,N-diethylamino-1-(4-Morpholinophenyl)-1-Butanone (Irgacure® 369, CIBA), and 0.05 g of 2,2'-(2,5-thiophenediyl)bis(t-butylbenzoxazole) (Uvitex® OB, CIBA) as initiator.

The adhesive solution from Example 1 was overcoated on C,Y,M and K elements and dried.

Using the procedure from Example 1, the Magenta element was laminated to the support, imagewise exposed and peel-developed. This was followed, in registration, with Cyan and Yellow elements. The last element down, Black, contained Irgacure® 369/fluorescent optical brightener combination as initiator.

This procedure yielded a high-quality 4-color proof. This proof, when blanket-exposed to actinic radiation in order to photoharden the top layers, turned substantially yellow (Yellow density=0.22)

EXAMPLE 2

This example shows a preparation of a four-color proof using the present invention.

The formulations for the color layers include the following ingredients in parts by weight.

| Ingredient - Color Layer | Cyan | Yellow | Magenta | Black |
|---|---|---|---|---|
| Tetrahydrofuran | 200 | 200 | 200 | 200 |
| 4-hydroxy-4-methyl pentanone | 150 | 150 | 150 | 150 |
| 1-methoxy-2-propanol | 444 | 465 | 489 | 490 |
| Formvar® 12/85 resin | 12 | 13 | 15 | 18 |
| Sartomer® 369 (Sartomer Co, Hydroxyethyl isocyanurate triacrylate monomer) | 10 | 12 | 16 | 15 |
| Hostaperm® B2G | 14 | — | — | — |
| Permanent Yellow GR | — | 14 | — | — |
| Permanent Red FBB | — | — | 24 | — |
| Printex® 25 | — | — | — | 24 |

The pigments were dispersed in some of the Formvar® 12/85 and solvents. The color solutions were coated on the crosslinked phenolic layer from comparative Example 1 with a Meyer® rod #12 and dried. The photoadhering solution from Comparative Example 1 was overcoated on Cyan, Yellow, and Magenta color layer with a Meyer® rod #24, and dried.

The following photoadhering solution was used for the Black color layer:

To 10 g of the stock photoadhering solution from Comparative Example 1, there were added 0.38 g of Sartomer® 399 Dipentaerythritol pentaacrylate (available from the Sartomer Co.), as monomer, and 0.1 g of 2,4,6-trimethylbenzoyl diphenyl phosphine oxide (Lucirin® TPO, BASF) and 0.05 g of 2,2'-(2,5-thiophenediyl)bis(t-butylbenzoxazole) (Uvitex® OB, CIBA) as initiator.

The adhesive solution from Example 1 was overcoated on C,Y,M and K elements and dried.

Using the procedure from Example 1, the Magenta element was laminated to the support, imagewise exposed and peel-developed. This was followed, in registration, with Cyan and Yellow elements. The last element down, Black contained acyl phosphine oxide/fluorescent optical brightener combination as initiator.

This procedure yielded a high-quality 4-color proof.

This proof; when blanket-exposed to actinic radiation in order to photoharden the top layers, did not turn substantially yellow (Yellow density=0.06)

EXAMPLE 3

This example shows a preparation of a four-color proof using the present invention. The formulations for the color layers include the following ingredients in parts by weight.

| Ingredient - Color Layer | Cyan | Yellow | Magenta | Black |
|---|---|---|---|---|
| Tetrahydrofuran | 200 | 200 | 200 | 200 |
| 4-hydroxy-4-methyl pentanone | 150 | 150 | 150 | 150 |
| 1-methoxy-2-propanol | 444 | 465 | 489 | 490 |
| Formvar® 12/85 resin | 12 | 13 | 15 | 18 |
| Sartomer® 369 (Sartomer Co, Hydroxyethyl isocyanurate triacrylate monomer) | 10 | 12 | 16 | 15 |
| Hostaperm® B2G | 14 | — | — | — |
| Permanent Yellow GR | — | 14 | — | — |
| Permanent Red FBB | — | — | 24 | — |
| Printex® 25 | — | — | — | 24 |

The pigments were dispersed in some of the Formvar® 12/85 and solvents. The color solutions were coated on the crosslinked phenolic layer from Comparative Example 1 with a Meyer® rod #12 and dried. The photoadhering solution from Comparative Example 1 was overcoated on Cyan, Yellow, and Magenta color layer with a Meyer® rod #24, and dried.

The following photoadhering solution was used for the Black color layer:

To 10 g of the stock photoadhering solution from Comparative Example 1, there were added 0.38 g of Sartomer® 399 Dipentaerythritol pentaacrylate (available from the Sartomer Co.), as monomer, and 0.1 g of 2,2'-bis-(o-chlorophenyl)-4,5,4',5'-tetraphenyl-1,2'-biimidazole, 0.05 g of mercaptobenzoxazole and 0.05 g of 2,2'-(2,5-thiophenediyl)bis(t-butylbenzoxazole) (Uvitex® OB, CIBA) as initiator.

The adhesive solution from Example 1 was overcoated on C,Y,M and K elements and dried.

Using the procedure from Example 1, the Magenta element was laminated to the support, imagewise exposed and peel-developed. This was followed, in registration, with Cyan and Yellow elements. The last element down, Black, contained hexaaryl biimidazole/chain transfer agent/ fluorescent brightener combination as initiator.

This procedure yielded a high-quality 4-color proof.

This proof, when blanket-exposed to actinic radiation in order to photoharden the top layers, did not turn substantially yellow (Yellow density=0.08)

What is claimed is:

1. A method for producing a negative image which comprises:

A) providing a photosensitive element which comprises, in order from top to bottom:
   (i) a strippable, transparent cover sheet;
   (ii) a crosslinked layer, which comprises a polymer having phenolic groups;
   (iii) a color layer, which comprises an organic binder, a polymerizable monomer, a colorant, and optionally, a photoinitiator, wherein the binder is present in sufficient amount to bind the color layer components into a uniform film, wherein the optional photoinitiator, when present, is present in sufficient amount to initiate polymerization of the polymerizable monomer in the color layer, wherein the polymerizable monomer is present in the color layer in sufficient amount to provide image differentiation when the element is imagewise exposed to actinic radiation and wherein the colorant is present in an amount sufficient to uniformly color the color layer;
   (iv) a photoadhering layer, which comprises a photosensitive polymer having ethylenically unsaturated, photocrosslinkable groups and a weight average molecular weight greater than 3,000, a polymerizable monomer having at least one ethylenically unsaturated group, and an optional photoinitiator, wherein the optional photoinitiator, when present, is present in sufficient amount to initiate polymerization of the polymerizable monomer in the photoadhering layer and the crosslinking of the photosensitive polymer, and wherein at least one of either the color layer or the photoadhering layer contains a photoinitiator,
   (v) a thermoplastic adhesive layer;

(B) laminating the photosensitive element to a receiver sheet;

(C) imagewise exposing the color layer and the photoadhering layer to actinic radiation through the transparent cover and crosslinked layer;

(D) peeling apart the receiver sheet and the transparent cover sheet, leaving exposed areas of the color layer attached to the receiver sheet via the photoadhering layer and adhesive layer, and unexposed areas being removed with the cover sheet and the crosslinked layer, thereby forming a colored negative image on the receiver sheet; and (E) optionally repeating steps A) through D) at least once wherein another photosensitive element having at least one different colorant, is transferred via its photoadhering and adhesive layers to the negative image previously produced on the receiver sheet, with the proviso that a photoinitiator which consists essentially of an acyl or diacyl phosphine oxide and a fluorescent optical brightener must be present at least in the photoadhering layer or the color layer of the top photosensitive element;

(F) either:
   (i) blanket exposing the image created in step (E) to actinic radiation to photoharden the top layers; or:
   (ii) providing the image created in step (E) with protective layer or layers, or both.

2. The method of claim 1 wherein both the color layer and the photoadhering layer contain a photoinitiator.

3. The method of claim 2, wherein the ethylenically unsaturated polymerizable monomer is present in the photoadhering layer and is delivered to the color layer by interlayer diffusion between the photoadhering layer and the color layer during assembly of the photosensitive element.

4. The method of claim 1 wherein the polymerizable monomer in the color layer and in the photoadhering layer comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, di-pentaerythritol pentaacrylate, trimethylol propane triacrylate, trimethylol propane trimethacrylate, pentaerythritol triacrylate, bisphenol A ethoxylate dimethacrylate, trimethylolpropane ethoxylate triacrylate, trimethylolpropane propoxylate triacrylate, bisphenol A diepoxide dimethacrylate and bisphenol A diepoxide diacrylate.

5. The method of claim 1 wherein both the color layer and the photoadhering layer of the top photosensitive element contain a photoinitiator consisting essentially of a combination of an acyl or diacyl phosphine oxide and a fluorescent optical brightener.

6. The method of claim 1 wherein the color layer comprises one or more binding resins selected from the group consisting of styrene/maleic anhydride copolymers and their half esters; acrylic polymers and copolymers; polyamides; polyvinyl pyrrolidones; cellulosic resins; phenolic resins; polyvinyl acetals; polyvinyl acetates; and their copolymers.

7. The method of claim 1 wherein the free radical polymerizable monomer is present in the photoadhering layer in an amount ranging from about 10% to about 40%, by weight, of the photoadhering layer.

8. The method of claim 1 wherein the photoinitiator component is present in the photoadhering layer in an amount ranging from about 5% to about 20%, by weight, of the photoadhering layer.

9. The method of claim 1 wherein the binder is present in the color layer in an amount ranging from about 20% to about 80%, by weight, of the color layer.

10. The method of claim 1 wherein the receiver sheet comprises polyethylene terephthalate.

11. The method of claim 1 wherein the cover sheet comprises polyethylene terephthalate.

12. The method of claim 1 wherein the color layer comprises a binder selected from the group consisting of styrene/maleic anhydride copolymers and their half esters; acrylic polymers and copolymers; polyamides; polyvinyl pyrrolidones; cellulose and its derivatives; phenolic resins; polyvinyl acetals; polyvinyl acetates; and their copolymers.

13. The method of claim 1 wherein the color layer further comprises one or more ingredients selected from the group consisting of plasticizers, tackifiers, stabilizers, antistatic compositions, UV absorbers, spectral sensitizers, optical brighteners, inert fillers, exposure indicators, polymerization inhibitors, surfactants, hydrogen atom donors, antihalation agents, and photoactivators.

14. The method of claim 1 wherein the coating weight of the photoadhering layer ranges from about 2 to 20 $g/m^2$.

15. The method of claim 1 wherein the photoadhering layer further comprises one or more ingredients selected from the group consisting of plasticizers, tackifiers, stabilizers, antistatic compositions, UV absorbers, spectral sensitizers, optical brighteners, inert fillers, exposure indicators, polymerization inhibitors, surfactants, hydrogen atom donors, antihalation agents, and photoactivators.

16. The method of claim 1 wherein each lamination is conducted at a temperature of from about 60° C. to about 120° C.

17. A photosensitive element which comprises, in order from top to bottom:

(i) a strippable, transparent cover sheet;

(ii) a crosslinked layer, which comprises a polymer having phenolic groups;

(iii) a color layer, which comprises an organic binder, a polymerizable monomer, a colorant, and optionally, a photoinitiator, wherein the binder is present in sufficient amount to bind the color layer components into a uniform film, wherein the optional photoinitiator, when present, is present in sufficient amount to initiate polymerization of the polymerizable monomer in the color layer, wherein the polymerizable monomer is present in sufficient amount to provide image differentiation when the element is imagewise exposed to actinic radiation, and wherein the colorant is present in an amount sufficient to uniformly color the color layer;

(iv) a photoadhering layer, which comprises a photosensitive polymer having ethylenically unsaturated, photocrosslinkable groups and a weight average molecular weight greater than 3,000, a polymerizable monomer having at least one ethylenically unsaturated group, and an optional photoinitiator, wherein the optional photoinitiator, when present, is present in sufficient amount to initiate polymerization of the polymerizable monomer in the photoadhering layer and the crossing of the photosensitive polymer, and wherein at least one of either the color layer or the photoadhering layer contains a photoinitiator, which consists essentially of: a combination of an acyl or diacyl phosphine oxide and a fluorescent optical brightener;

(v) a thermoplastic adhesive layer; and (vii) a receiver sheet.

18. The element of claim 17 wherein both the color layer and the photoadhering layer contain a photoinitiator.

19. The element of claim 17, wherein the ethylenically unsaturated polymerizable monomer is present in the photoadhering layer and is delivered from the photoadhering layer to the color layer by interlayer diffusion, during assembly of the photosensitive element.

20. The element of claim 19 wherein the polymerizable monomer comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, di-pentaerythritol pentaacrylate, trimethylol propane triacrylate, trimethylol propane trimethacrylate, pentaerythritol triacrylate, bisphenol A ethoxylate dimethacrylate, trimethylolpropane ethoxylate triacrylate, trimethylolpropane propoxylate triacrylate, diacrylate bisphenol A diepoxide dimethacrylate and bisphenol A.

21. The element of claim 17 wherein both the color layer and the photoadhering layer contain a photoinitiator which consists essentially of a combination of an acyl or diacyl phosphine oxide and a fluorescent optical brightener.

22. The element of claim 17 wherein the color layer comprises one or more binding resins selected from the group consisting of styrene/maleic anhydride copolymers and their half esters; acrylic polymers and copolymers; polyamides; polyvinyl pyrrolidones, cellulosic resins; phenolic resins; polyvinyl acetals, polyvinyl acetates; and their copolymers.

23. The element of claim 17 wherein the polymerizable monomer is present in the color layer in an amount ranging from about 5% to about 50%, by weight, of the color layer.

24. The element of claim 18 wherein the photoinitiator component is present in the photoadhering layer in an amount ranging from about 5% to about 20%, by weight, of the photoadhering layer.

25. The element of claim 17 wherein the binder is present in the color layer in an amount ranging from about 20% to about 80%, by weight, of the color layer.

26. The element of claim 17 wherein the receiver sheet comprises polyethylene terephthalate.

27. The element of claim 17 wherein the cover sheet comprises polyethylene terephthalate.

28. The element of claim 17 wherein the color layer further comprises one or more ingredients selected from the group consisting of plasticizers, tackifiers, stabilizers, antistatic compositions, uv absorbers, spectral sensitizers, optical brighteners, inert fillers, exposure indicators, polymerization inhibitors, surfactants, hydrogen atom donors, antihalation agents, and photoactivators.

29. The element of claim 17 wherein the coating weight of the photoadhering layer ranges from about 2 to 20 g/m$^2$.

30. The element of claim 17 wherein the photoadhering layer further comprises one or more ingredients selected from the group consisting of plasticizers, tackifiers, stabilizers, antistatic compositions, UV absorbers, spectral sensitizers, optical brighteners, inert fillers, exposure indicators, polymerization inhibitors, surfactants, hydrogen atom donors, antihalation agents, and photoactivators.

31. The element of claim 17 wherein the the receiver sheet comprises paper, coated paper, or polymeric film.

32. The method of claim 1 wherein steps A) through D) are repeated at least once and wherein the photoinitiator present in each color layer and each photoadhering layer under the photoadhering layer of the top photosensitive element contains a photoinitiator consisting essentially of at least one of a) chromophore-substituted bis-trichloromethyl-s-triazines, b) combinations of an acyl or diacyl phosphine oxide and a fluorescent optical brightener, or c) a hexaaryl biimidazole, a chain-transfer agent, and a fluorescent optical brightener.

33. The method of claim 1 wherein steps A) through D) are repeated at least once and wherein the photoinitiator present in each color layer and each photoadhering layer under the photoadhering layer of the top photosensitive element contains a photoinitiator consisting essentially of at least one chromophore-substituted bis-trichloromethyl-s-triazine.

34. The method of claim 1 wherein the top color layer comprises a black colorant.

* * * * *